United States Patent
Kim et al.

(10) Patent No.: US 8,068,368 B2
(45) Date of Patent: Nov. 29, 2011

(54) METHOD OF PERFORMING READ OPERATION IN FLASH MEMORY DEVICE

(75) Inventors: You Sung Kim, Seoul (KR); Duck Ju Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 86 days.

(21) Appl. No.: 12/702,199

(22) Filed: Feb. 8, 2010

(65) Prior Publication Data

US 2010/0135076 A1    Jun. 3, 2010

Related U.S. Application Data

(62) Division of application No. 11/962,060, filed on Dec. 20, 2007, now Pat. No. 7,660,160.

(30) Foreign Application Priority Data

Jan. 23, 2007    (KR) .................................. 2007-7046

(51) Int. Cl.
    G11C 16/06    (2006.01)
(52) U.S. Cl. ............ 365/185.2; 365/185.11; 365/185.33; 365/189.07; 365/230.03
(58) Field of Classification Search ............... 365/185.2, 365/185.11, 185.33, 189.07, 230.03
    See application file for complete search history.

(56) References Cited

U.S. PATENT DOCUMENTS

| | | | |
|---|---|---|---|
| 5,986,957 A | | 11/1999 | Ishii |
| 6,564,296 B2 * | | 5/2003 | Rechberger et al. .......... 711/115 |
| 6,624,962 B1 * | | 9/2003 | Kodama et al. ................ 360/75 |
| 6,954,378 B2 | | 10/2005 | Tanaka |
| 7,061,824 B2 | | 6/2006 | Chun |
| 7,139,201 B2 | | 11/2006 | Tanaka |
| 7,193,911 B2 | | 3/2007 | Kim |
| 7,257,032 B2 | | 8/2007 | Fujiu et al. |
| 7,334,080 B2 * | | 2/2008 | Takase et al. ................. 711/103 |
| 7,349,249 B2 | | 3/2008 | Honma et al. |
| 7,403,433 B2 | | 7/2008 | Ahmad |
| 7,486,790 B1 * | | 2/2009 | Selinfreund et al. .......... 380/201 |
| 7,545,673 B2 * | | 6/2009 | Lasser ....................... 365/185.03 |
| 7,660,160 B2 * | | 2/2010 | Kim et al. ................... 365/185.2 |
| 7,821,834 B2 * | | 10/2010 | Sel et al. ................... 365/185.17 |
| 2005/0281089 A1 | | 12/2005 | Sukegawa |
| 2006/0120162 A1 | | 6/2006 | Fujiu et al. |
| 2007/0245069 A1 | | 10/2007 | Kikuchi |

FOREIGN PATENT DOCUMENTS

CN    1362708 A    8/2002
WO    WO 2006/028283 A1    3/2006

* cited by examiner

*Primary Examiner* — Viet Nguyen

(74) *Attorney, Agent, or Firm* — Kilpatrick Townsend & Stockton LLP

(57) ABSTRACT

A method of performing a read operation in a flash memory device is disclosed. The flash memory has a memory cell array including at least one block, the block having a plurality of pages. The method comprises receiving a read command to read data from a selected page in the block; determining whether or not the block has any page that has not been programmed; performing a dummy data program operation on at least one page that is determined not to have been programmed; and executing the read command to read the data of the selected page after the dummy data program operation is completed.

6 Claims, 4 Drawing Sheets

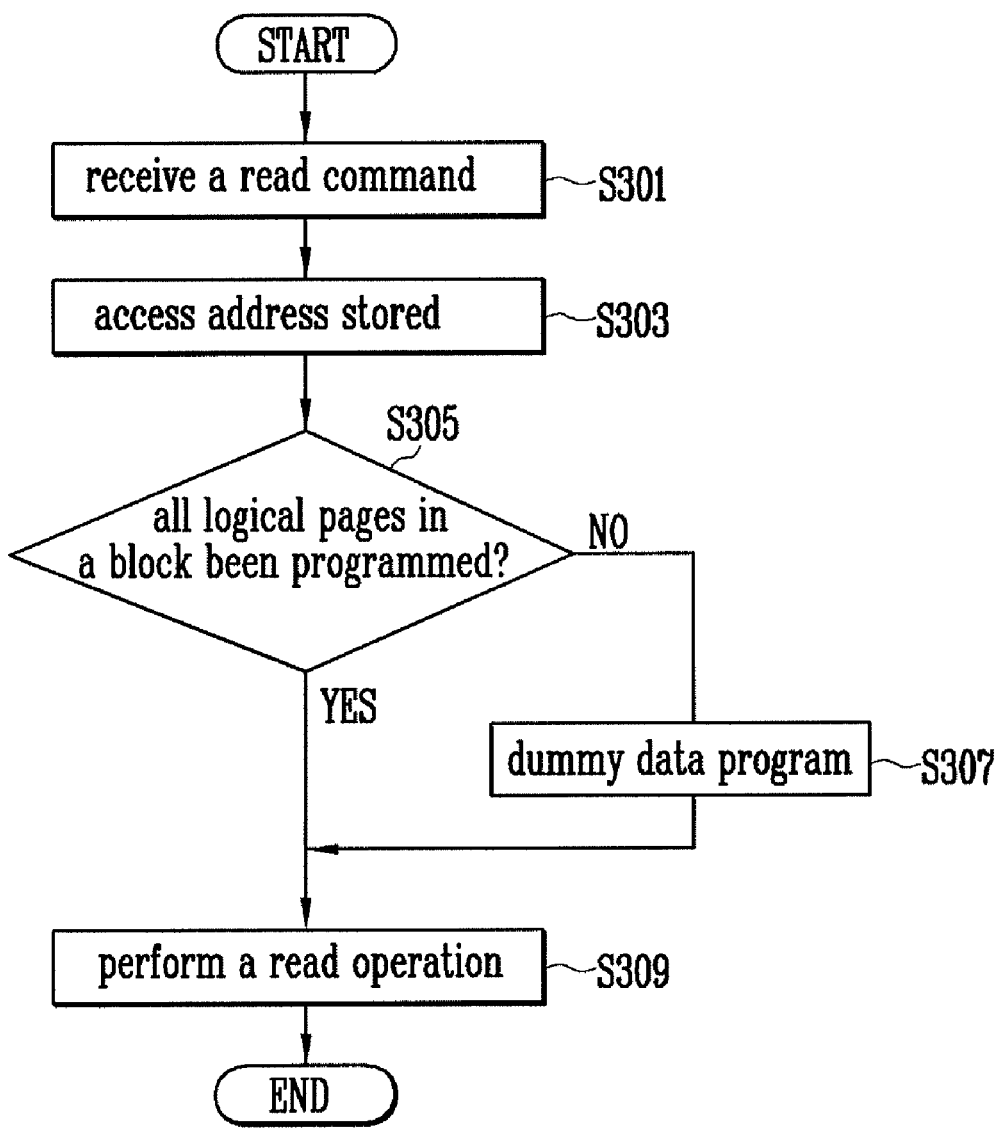

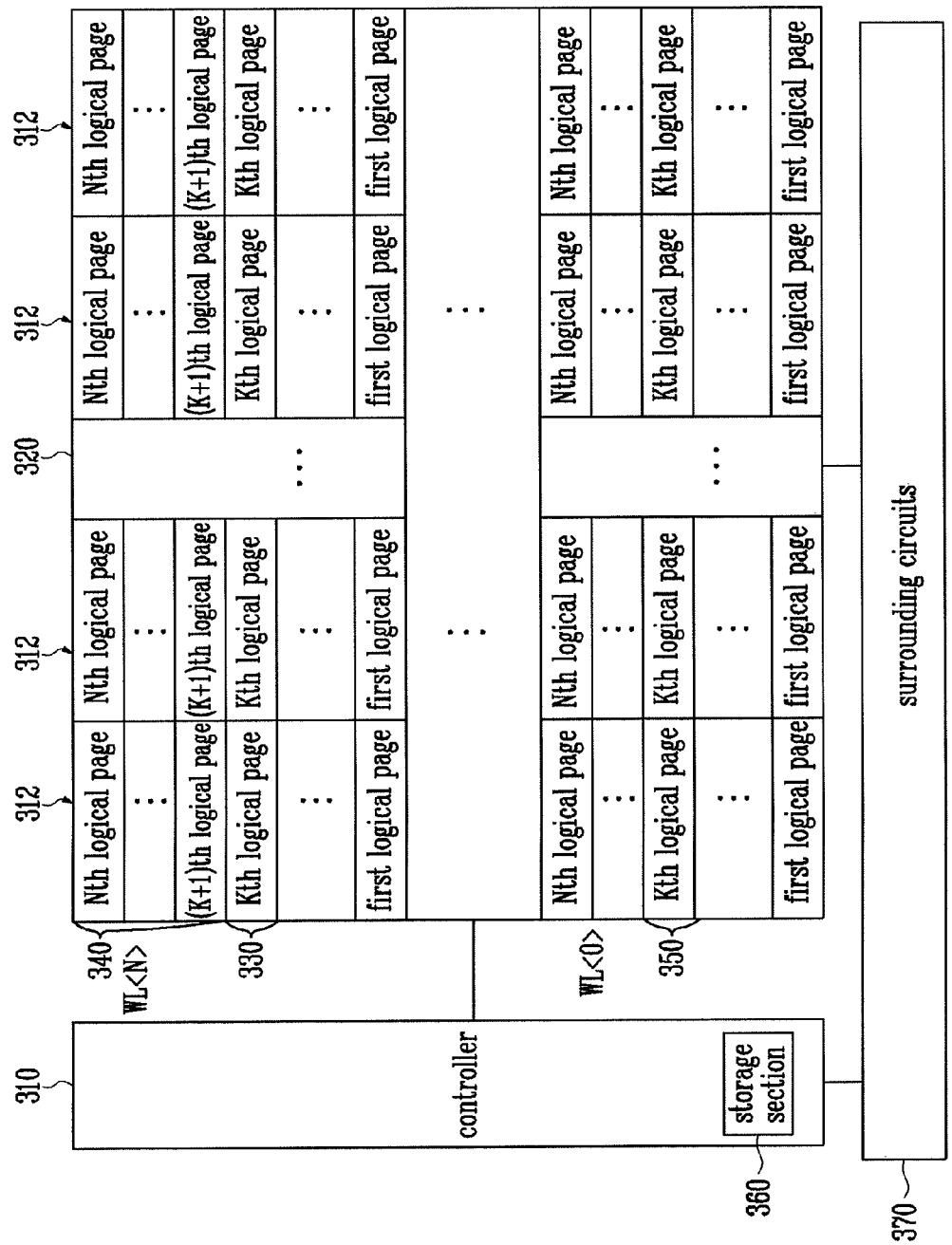

METHOD OF PERFORMING READ OPERATION IN FLASH MEMORY DEVICE

CROSS-REFERENCE TO RELATED APPLICATIONS

This application is a divisional of U.S. patent application Ser. No. 11/962,060, filed on Dec. 20, 2007 now U.S. Pat. No. 7,660,160, and claims priority from Korean Patent Application No. 2007-7046, filed on Jan. 23, 2007, the contents of which are incorporated herein by reference in their entirety.

BACKGROUND OF THE INVENTION

The present invention relates to a flash memory device having a multi-level cell. More particularly, the present invention relates to a method for performing a read operation at a set voltage level irrespective of a LSB or MSB program operation of a certain cell.

Generally, flash memory is categorized into a NAND or NOR flash memory. Here, the NOR flash memory has excellent random access time characteristics because memory cells are independently connected to a bit line and a word line. Whereas, in the NAND flash memory, only one contact is required for one cell string because memory cells are serially connected and so the NAND flash memory has excellent characteristics in view of the degree of integration. Accordingly, the NAND flash memory is generally employed in highly integrated flash memory.

Recently, a multi-bit cell for storing a plurality of data in one memory cell has been actively studied for the purpose of increasing the degree of integration of the flash memory. This memory cell is referred to as a multi-level cell (MLC). The memory cell for storing one bit is referred to as a single level cell (SLC).

Generally, the MLC may be programmed by multi-levels.

FIG. 1 is a view illustrating a threshold voltage distribution in accordance with a program of a MLC flash memory.

FIG. 1 shows the voltage distribution of the MLC for storing at least two bits programmed by the variable level method.

As shown in FIG. 1, an erase cell 110 and a program cell 120 have voltage distributions based on a voltage V1 when the least significant bit (LSB) is programmed. An extra flag cell F is included in each word line of the flash memory so as to indicate if only the LSB has been programmed (e.g., a first state 170) or if both the LSB and MSB have been programmed (e.g., a second state 180).

When the program of the most significant bit (MSB) is finished, the erase cell 110 is converted into the erase cell 130 and 140 and the program cell 120 is converted into program cells 150 to 160. Additionally, the flag cell F is programmed based on a voltage V5 (i.e., the second state180) and so the flag cell F is used to indicate that both the most significant bit and the least significant bit have been programmed.

FIG. 2A illustrates a representation of a memory block in a MLC flash memory.

Referring to FIG. 2A, a memory cell array 200 in the MLC flash memory includes memory cells 210 and flag cells 220. Each memory cell 212 of the memory cell array is configured to store data of 2 bits or more. In FIG. 2A, each memory cell 212 is indicated as being able to store data of 2 bits for illustrative convenience. The flag cells 220 are used to indicate a program condition of the memory cells connected to the same word line, i.e., the memory cells in the same page. Each word line is coupled to a plurality of memory cells and a flag cell.

The flag cell 220 indicates whether or not a high program operation has been conducted for the corresponding page. If the flag cell 220 is in the second state 180 (see FIG. 1), a high program operation has been performed, where both the least significant bit page and the most significant bit page have been programmed. For example, when the memory cell 212 is configured to store data of 2 bits, each of the word lines WL<0> to WL<N> may perform an operation to program the least significant bit page and another operation to program the most significant bit page. If the word line WL<0> have programmed both the least significant bit page and the most significant bit page, the flag cell F is programmed to the second state 180 to indicate that the high program operation has been performed.

However, in the case that (k−1)th word line WL<k> programs only the least significant bit page, the flag cell F<k> related to the (k−1)th word line WL<k> maintains the condition of the erase cell 170 not programmed to indicate that only least significant bit page is programmed.

FIG. 2B is a view illustrating a program order of the memory block in FIG. 2A, where the programming is done in a unit of page. The memory block is connected to the word lines WL<0> to WL<N>. Each word line is connected to a plurality of memory cells and a flag cell that together define a physical page.

The multi-level cell 212 is configured to store data of N bits. Each multi-level cell 212 may be programmed to N different states by the corresponding word line. Accordingly, each physical page provides N logical pages.

The MLC flash memory performs a program in a unit of a logical page in accordance with an order set in response to inputted data. Here, the MLC flash memory programs in the order of from a first logical page to an Nth logical page in each of the word lines WL<0> to WL<N>, or performs the program in a unit of a logical page in accordance with the order set by referring to an interference between surrounding memory cells, etc.

A common method used involves controlling the program so that adjacent pages are not continuously programmed when the program is performed in a unit of the logical page.

In addition, an address counter (not shown) counts an address in accordance with the preset page order to perform the program of the inputted data.

Further, a flag cell F is programmed in accordance with a program state of the first to Nth logical pages during the program operation. As a result, the flag cell F shows information on the program state of the word line.

For example, if the first to Nth logical pages related to the first word line WL<0> in FIG. 2B have all been programmed, the flag cell F<0> is programmed to be in the second state 180. Here, the flag cell F commonly used is a SLC.

As explained above, if the memory cell stores data of N bits, the corresponding word line has N logical pages. Accordingly, the program operation has been N number of times.

For example, if the memory cell stores data of four bits, the corresponding word line would have four logical pages. As a result, the program operation would need to be performed four times to finish programming all four logical pages associated with the word line. In such a case, the flag cell F should have two SLCs to indicate four program states.

In the read operation for the flash memory cell above, the data of the flag cell F is read first to obtain the program state information. An appropriate threshold voltage is selected using the program state information of the flag cell. The selected threshold voltage is then used to read the data stored in the memory cell.

To perform the above method, the number of the SLCs included in the flag cell F should be increased according to the number of bits the memory cell is configured to store. This may reduce the number of memory cells that could be used to store data.

Additionally, since a voltage level for reading data stored in the memory cell is determined after the program state is verified by reading the flag cell F, it would be difficult to read the data stored in the memory cell if the data in the flag cell F has an error. Moreover, a time required for the read operation may be increased as the number of the flag cell F is increased.

SUMMARY OF THE INVENTION

The present invention relates to a MLC non-volatile memory device that can operate without a flag cell, where the flag cell indicates the program state of a memory cell. The non-volatile memory device may be a NAND or NOR flash memory device.

In one embodiment, a flash memory device includes a memory cell array configured to have at least one block including a plurality of physical pages, each physical page defining a plurality of logical pages. A controller is configured to initiate a dummy data program operation to program any logical page of the block that has not been programmed, before allowing a read command to be executed. The controller has a storage section for storing dummy data for use in the dummy data program operation. The controller is configured to generate randomly dummy data for use in the dummy data program operation, wherein the block does not include any flag cell. The memory cell array has at least one redundant page to store dummy data during the dummy data program operation.

One embodiment relates to a method of performing a read operation in a flash memory device having a memory cell array including at least one block, the block having a plurality of pages. The method comprises receiving a read command to read data from a selected page in the block; determining whether or not the block has any page that has not been programmed; performing a dummy data program operation on at least one page that is determined not to have been programmed; and executing the read command to read the data of the selected page after the dummy data program operation is completed.

In one embodiment, the dummy data program operation programs dummy data to all pages that are determined not to have been programmed. The block includes a plurality of physical pages, each physical page defining a plurality of logical pages, wherein the determining step involves determining whether or not all the logical pages in the block have been programmed. The dummy data program operation programs dummy data to a redundant page.

Another embodiment relates to a method of programming data in a flash memory device having a memory cell array including at least one block, the block including a plurality of pages. The method comprises receiving a program command to program a plurality of pages in the block; programming the plurality of pages in a predefined order; and storing an address corresponding to a page that was programmed last amongst the plurality of pages. The plurality of pages is programmed in an ascending order.

Yet another embodiment relates to a method of performing a read operation in a flash memory device having a memory cell array including at least one block, the block having a plurality of pages. The method comprises receiving a read command to read a selected page in the block; determining whether or not all pages in the block have been programmed; performing a dummy data program operation on any page in the block that is determined not to have been programmed; and executing the read command to read the selected page after performing the dummy data program operation. The dummy data program operation programs dummy data to the pages that are determined not to have been programmed. Alternatively, the dummy data program operation programs dummy data to a redundant page in the block.

In yet another embodiment, a flash memory device includes a memory cell array, a controller, page buffers, an X decoder and a Y decoder. The memory cell array has at least one block including a plurality of pages. The controller discriminates whether or not every pages of the block are programmed in accordance with a read command, performs a dummy data program about a page not programmed in accordance with the discrimination result, and outputs a controlling signal for performing a read operation in accordance with the read command. The page buffers programs or reads data of the memory cell array under control of the controller. The X decoder decodes an address of a page in response to a program command or the read command of the controller, and outputs a program voltage or a read voltage by activating a page selected in accordance with the decoding result. The Y decoder decodes a column address in response to the program command or the read command of the controller, and outputs page buffer controlling signals and a data input/output controlling signal in accordance with the decoding result.

As described above, in a flash memory device and a method of operating the same of the present invention, a read operation is performed without a flag cell for showing a program state. Accordingly, the size of a chip related to the flash memory device may be reduced.

BRIEF DESCRIPTION OF THE DRAWINGS

FIG. 3A is a flow chart illustrating a program operation of a flash memory device according to one embodiment of the present invention; and FIG. 3B illustrates a memory block and a controller according to one embodiment of the present invention.

DESCRIPTION OF SPECIFIC EMBODIMENTS

Figure 1:
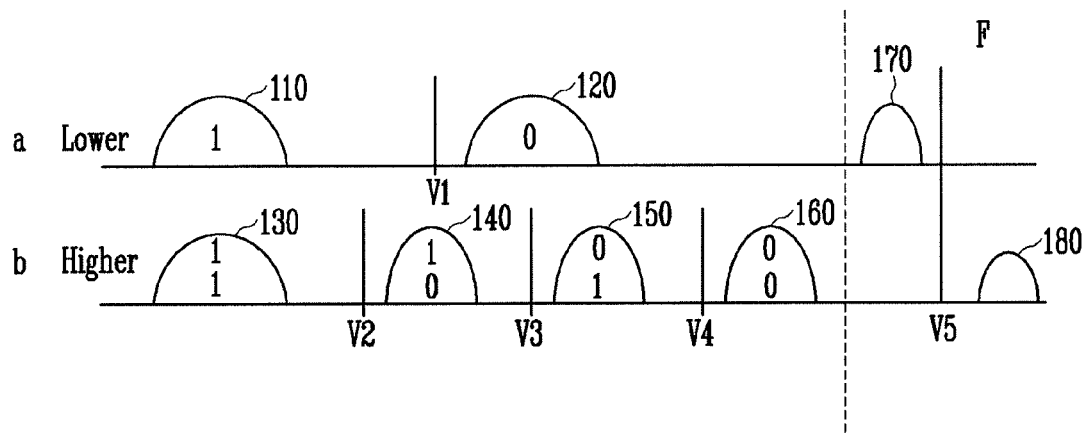
FIG. 1 is a view illustrating a threshold voltage distribution in accordance with a program of a MLC flash memory.
Figure 2A:
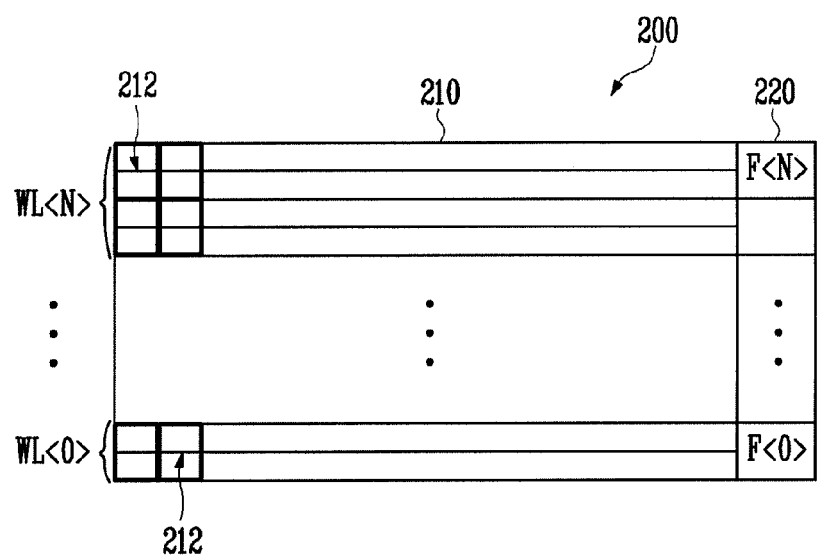
FIG. 2A illustrates a representation of a memory block in a MLC flash memory.
Figure 2B:
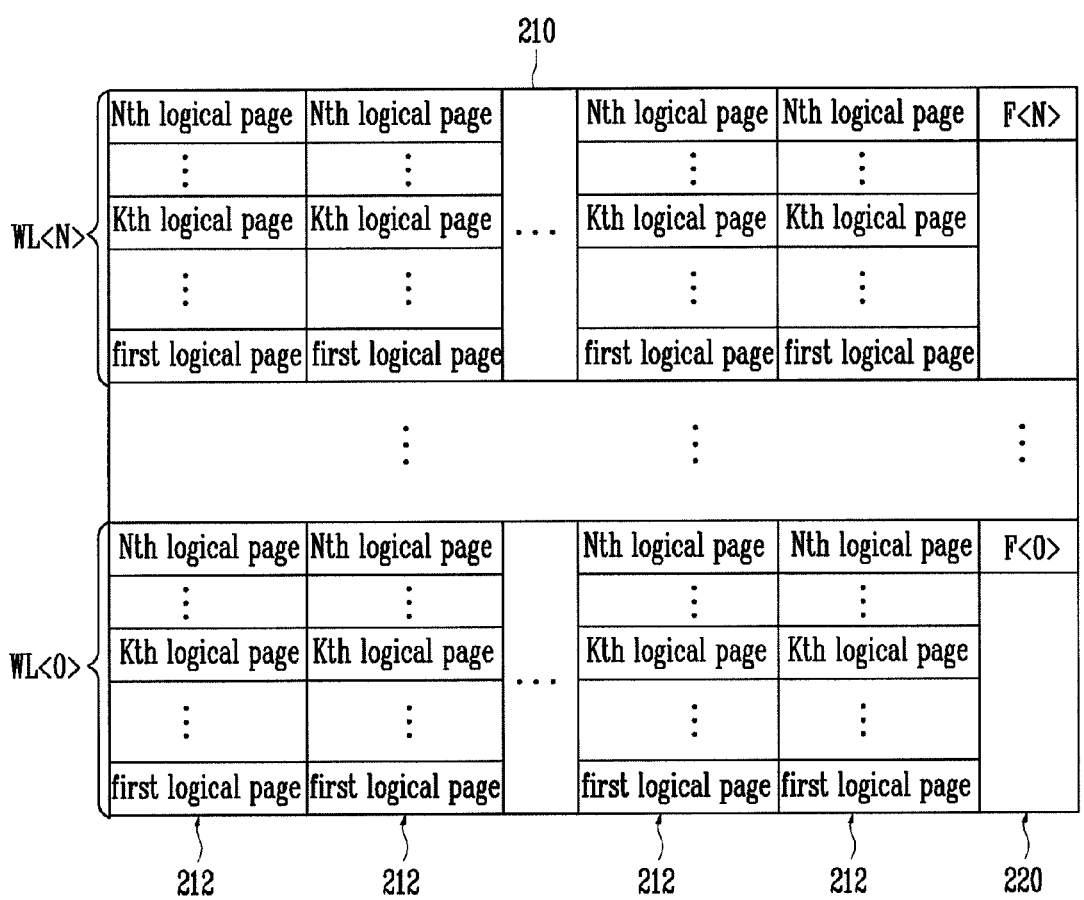
FIG. 2B is a view illustrating a program order of a block in FIG. 2A in accordance with the page.

FIG. 3A is a flow chart illustrating a program operation of a non-volatile memory device (e.g., flash memory device) according to one embodiment of the present invention. FIG. 3B illustrates a memory block and a controller according to one embodiment.

Referring to FIG. 3B, the flash memory device of the present embodiment includes a memory cell array (not shown) having at least one block 320 and a controller 310 that controls surrounding circuits 370 so that a program operation is performed by transmitting data inputted in response to an address of a page corresponding to a preset word line to the block 320. A configuration of the memory cell array (or block 320) is described in more detail in U.S. Pat. No. 7,193,911, which is incorporated by reference. The memory cell array described in the '911 patent relates to the NAND flash memory device. However, the memory cell array (or memory block) is not limited to a NAND configuration in the present embodiment and may include other configurations, e.g., a NOR configuration.

The memory block 320 is connected to a plurality of word lines WL<0> to WL<N>. Each word line is connected to a plurality of memory cells 312 that together define a physical page. The memory cell 312 is a multi-level cell that is configured to store data of N bits. Each multi-level cell 312 may be programmed to N different states by the corresponding word line. Accordingly, each physical page may define up to N number of logical pages, depending on how many times the physical page has been programmed. The data in the memory cell 312 (or block 320) are read in accordance with a read command received.

The controller 310 controls the program operation in accordance with data transmitted from the surrounding circuits 370 and an order set by a program command. In one embodiment, the controller 310 stores the address of a page that has been programmed last. The address stored may include information on both the physical page and the logical page. The program operation generally starts from the first word line WL<0>. The program operation is performed in a unit of a logical page, so that a selected logical page is programmed each time. The controller 310 may be configured to program the logical pages in a predetermined order.

For example, a program operation may program the logical pages in sequence from a first logical page to an Nth logical page of a given word line (e.g., WL<0>). Once all the logical pages of the word line have been programmed, the logical pages of the next word line are programmed in sequence (e.g., from a first page to an Nth page of the next word line WL<1>). Alternatively, the program operation may be performed in a predefined order that does not proceed sequentially.

Generally, the programming order is set in advance by using an algorithm that maximizes the data storage efficiency. In such a method, the adjacent logical pages are not continuously programmed to reduce the interference between the adjacent logical pages.

For example, the first page of each word line WL<0> to WL<N> is programmed in sequence, and then the second page of each word line WL<0> to WL<N> is programmed. In other words, a different physical page is programmed each time, so that the adjacent logical pages are not programmed in sequence.

The controller 310 controls how a program operation is carried out with the assistance from the surrounding circuits 370, such as, a page buffer, an X decoder, a Y decoder, and a voltage supplying circuit. In one embodiment, the controller 310 stores an address of the last page programmed for a given program operation. In one implementation, only the physical page (i.e., word line) address is stored. In another implementation, both the physical and logical page addresses are stored. The controller 310 uses the stored page address to determine what page to program in a subsequent program operation.

In the present embodiment, the controller 310 is configured to handle a read command as shown in FIG. 3A. If the surrounding circuits 370 receives a read command (step S301), the controller 310 accesses the page address stored in the controller to determine what is the next page to be programmed in the next program operation (step S303). Accordingly, the stored page address may point to the page that was programmed last or the page that is to be programmed next according to implementations. Also the stored page address may indicate a physical page, a logical page, or both according to implementations.

At step S305, it is determined whether or not all logical pages in the block have been programmed. One way to determine this is to use the page address stored in the controller. For example, if the page address points to the last logical page of the last physical page in the block as having been the page that was programmed last, then a determination is made that all logical pages in the block have been programmed.

At step S309, the controller 310 controls the surrounding circuits 370 to execute the read command if it has been determined that all pages in the block had been programmed. Here, since the memory cell for storing data of N bits has $2^N$ voltage levels when every page of the block 320 is programmed, the controller 310 controls the read operation so that the read operation is performed by using a read voltage corresponding to the set voltage levels.

At step S307, if it is determined that all pages in the block have not been programmed, the controller 310 performs a dummy data program to "dummy program" the logical pages that had not been programmed. That is, the dummy data program operation programs data to a residual page of the block 320 which has not been programmed. The dummy data program operation programs dummy data in sequence from the page corresponding to the address stored in the controller 310 to the last page of the block 320. All word lines WL<0> to WL<N> are programmed when the dummy data program is performed, and so the word lines WL<0> to WL<N> are converted into a final voltage level, i.e., into a readable state.

This dummy program operation shifts the threshold voltages of the memory cells that were not previously programmed. As a result, the controller can select the appropriate set voltage level for the read operation without using the program state information of the flag cells.

Hereinafter, the above operation will be described in detail with reference to FIG. 3B. The program operation starts when the controller 310 receives a program command. The program operation is performed up to a Kth logical page of the (N+1)th word line in accordance with the program command. The (N+1)th word line is the last word line WL<N> since the first word line is WL<0>. The program operation ends after the Kth logical page has been programmed.

The controller 310 stores the information that the next logical page to be programmed in the subsequent program operation is a (k+1)th logical page of WL<N>. This can be done by storing the address of the (k+1) page or the kth page according to the implementation. If the address of the kth page is stored, then the controller would need to be configured accordingly, so that it would be understood that the address stored points to the page that was programmed last, not the page that is to be programmed next.

In the present example, the programming has been performed to the Kth logical page 330 of WL<N>. That is, all the logical pages in the block 320 have been programmed except for a group of logical pages 340 (from the (K+1)th to Nth) in WL<N>. If a read command for reading data in the Kth logical page 350 of the first word line WL<0> is received by the surrounding circuits 370 in step of S301, the controller 310 accesses the address stored after the last program operation to determine the page that was programmed last. Depending on the implementation, the address stored may be the page that is to be programmed next. The controller can use the address stored to determine whether or not all logical pages in the block have been programmed.

In this case, the controller 310 determines the group of logical pages 340 (i.e., the (K+1)th to Nth logical pages of WL<N>) have not been programmed. The controller 310 controls the surrounding circuits 370 to program the dummy data to the redundant pages, so that the (K+1)th to Nth logical pages of WL<N> are performed in accordance with the dummy data program. Here, the dummy data are stored in advance in a storage section 360 included in the controller 310. In another embodiment, every datum in the dummy data may be '1' or '0', i.e., the dummy data is meaningless data.

After the dummy data program has finished "dummy programming" the Nth logical page of WL<N>, the controller 310 allows the data from the Kth logical page of WL<0> to be read. Here, since all the pages have been programmed, the read operation uses a read voltage corresponding to $2^N$ voltage levels.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of performing a read operation in a flash memory device having a memory cell array including at least one block, the block having a plurality of pages, the method comprising:
   receiving a read command to read data from a selected page in the block;
   determining whether or not the block has any page that has not been programmed;
   performing a dummy data program operation on at least one page that is determined not to have been programmed; and
   executing the read command to read the data of the selected page after the dummy data program operation is completed.

2. The method of claim 1, further comprising:
   programming the pages in the block in a predefined order; and
   storing an address corresponding to a page that is programmed last,
   wherein the step of the programming and storing is performed before the read command is executed.

3. The method of claim 2, wherein the determining step includes:
   determining whether or not the address stored indicates that the last page of the block has been programmed.

4. The method of claim 1, wherein the dummy data program operation programs dummy data to all pages that are determined not to have been programmed.

5. The method of claim 1, wherein the block includes a plurality of physical pages, each physical pages defining a plurality of logical pages, wherein the determining step involves determining whether or not all the logical pages in the block have been programmed.

6. The method of claim 1, wherein the dummy data program operation programs dummy data to a redundant page.

* * * * *